United States Patent [19]
Vodakov et al.

[11] 3,986,193

[45] Oct. 12, 1976

[54] SEMICONDUCTOR SICL LIGHT SOURCE AND A METHOD OF MANUFACTURING SAME

[76] Inventors: Jury Alexandrovich Vodakov, prospekt Engelsa, 69/1, kv. 35; Galina Alexandrovna Lomakina, prospekt Engelsa, 69/1, kv. 109; Evgeny Nikolaevich Mokhov, prospekt Energetikov, 54, korpus 2, kv. 59, all of Leningrad; Igor Ivanovich Kruglov, 15 Parkovaya, 46, korpus 1, kv. 35; Igor Veniaminovich Ryzhikov, 9 Parkovaya ulitsa, 49, korpus 1, kv. 67, both of Moscow; Vadim Ivanovich Pavlichenko, ulitsa Polevaya, 20/1, Kaliningrad Moskovskoi oblasti; Tatyana Georgievna Kmita, Odesskaya ulitsa 17, kv. 63, Moscow; Georgy Fedorovich Kholuyanov, ulitsa Manchesterskaya, 18, kv. 73; Eduard Efimovich Violin, prospekt Nauki, 16, korpus 1, kv. 89, both of Leningrad, all of U.S.S.R.; Jury Petrovich Maslakovets, deceased, late of Leningrad, U.S.S.R.; by Irina Vladimirovna Valter-Maslakovets, administratrix, ulitsa Vsevoloda Vishnevskogo, 18, kv. 24, Leningrad, U.S.S.R.

[22] Filed: June 13, 1975

[21] Appl. No.: 586,791

Related U.S. Application Data

[63] Continuation of Ser. No. 330,587, Feb. 8, 1973, abandoned.

[52] U.S. Cl. ............................ 357/17; 357/61; 357/63; 148/190
[51] Int. Cl.² ............................................ H01L 33/00
[58] Field of Search ............... 357/17, 63, 61, 18; 148/190

[56] References Cited

UNITED STATES PATENTS

| | | | |
|---|---|---|---|
| 3,458,779 | 7/1969 | Blank | 317/234 |
| 3,829,333 | 8/1974 | Tohi et al. | 148/1.5 |

*Primary Examiner*—Martin H. Edlow
*Attorney, Agent, or Firm*—Holman & Stern

[57] ABSTRACT

A semiconductor light source using nitrogen-doped n-type silicon carbide with a p-n junction electroluminescent within the visible region of the spectrum, and with a p-layer doped with an acceptor impurity, wherein the uncompensated majority donor concentration in said silicon carbide is $0.8 \times 10^{18}$ to $5 \times 10^{18}$ cm$^{-3}$, the p-layer is doped with an acceptor impurity with a minimum activation energy and with a solubility in silicon carbide of about $10^{19}$ to $10^{20}$ cm$^{-3}$, the uncompensated donor concentration in the base layer is $0.8 \times 10^{18}$ to $5 \times 10^{18}$ cm$^{-3}$ and a central layer, 0.05 to 1 micron thick, located between the p-layer and the base layer is doped with luminescence activators of donor and acceptor types to a concentration of $0.1 \times 10^{18}$ to $2 \times 10^{18}$ cm$^{-3}$ and has a resistivity greater than the resistivity of the base layer by at least three orders of magnitude.

10 Claims, 1 Drawing Figure

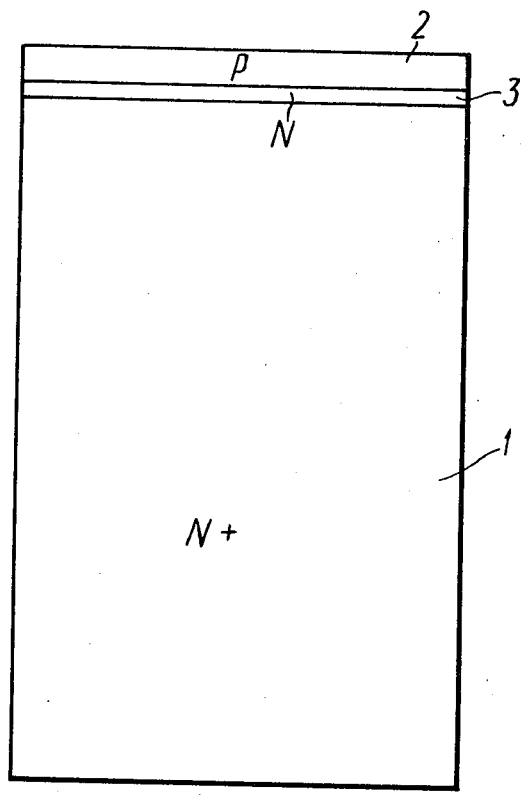

SEMICONDUCTOR SICL LIGHT SOURCE AND A METHOD OF MANUFACTURING SAME

This is a continuation of application Ser. No. 330,587 filed Feb. 8, 1973, now abandoned.

The invention relates to semiconductor devices, more particularly to semiconductor light sources and methods of manufacturing same.

It is known to use semiconductor light sources using n-type silicon carbide, which have a p-n-n$^+$ structure, where n$^+$ denotes an n-type material of high conductivity. In this structure the p-type layer and the intermediate compensated n-type layer are relatively wide and have a high resistivity. The structure emits amber light. Such a structure was obtained by boron diffusion or by simultaneous diffusion of aluminium and boron.

All known methods of forming electroluminescent p-n junctions on silicon carbide and other semiconductors depend on the use of one and the same impurity to form an inversion region, i.e. the region whose conductivity is opposite to that or the base material, and an activated region adjacent to the former one, in which radiative recombination mainly takes place.

However, silicon carbide light sources with such structure provide low brightness of light emission, which is about 15 to 25 nit at a current density of 0.5 A/cm$^2$, have a sublinear dependence of light emission on current $I \sim j^n$ at current densities exceeding 0.7 A/cm$^2$, where "I" is the emission brightness, "$j$" is the current density and "$n$" is 0.5 to 0.7.

Another disadvantage of such devices is that the forward voltage drop across them sharply rises by approximately 2 to 3 times and the emission efficiency decreases when the temperature varies from +20° C to −60° C. These disadvantages are mainly due to a high activation energy and a high diffusion coefficient of boron owing to which the comparatively wide diffused layer of p-type and the compensated intermediate layer of p or n type doped with boron have a relatively high resistivity and their properties are strongly affected by temperature. At the same time aluminium which has a much smaller diffusion coefficient than boron, when diffused together with the latter, slightly decreases the resistivity of the thin surface layer of the diffused p-region of the p-n junction without, however, appreciably changing the characteristics of the structure.

The object of the invention is to avoid these disadvantages by providing a semiconductor light source, and a method of manufacturing same, which has a nearly linear dependence of emission brightness on current, effectively operates at high current densities and features a much smaller increase of the forward voltage drop and a much smaller decrease of radiation efficiency at ambient temperatures down to −60° C and below.

With this object in view, in the semiconductor light source comprising a nitrogen-doped silicon carbide crystal forming a base region, provision is made for a p-layer 0.01 to 1 micron thick and doped with an acceptor impurity and a solubility in silicon carbide of about $2 \times 10^{18}$ to $2 \times 10^{20}$ cm$^{-3}$, an intermediate layer between said two layers and doped with luminescence activators of donor and acceptor types to concentrations of $0.1 \times 10^{18}$ to $2 \times 10^{18}$ cm$^{-3}$ and a p-n junction, formed by layers of p and n types, the resistivity of said intermediate layer being greater than the resistivity of the base layer by at least three orders of magnitude.

The p-layer may be doped with aluminium or gallium while oxygen and boron or nitrogen and boron may be used as luminescence activators of donor and acceptor types, respectively.

Nitrogen and oxygen may be used as luminescence activators of donor type, beryllium or aluminium or gallium or scandium may be used as luminescence activators of acceptor type.

With the same object in view, the method of manufacturing a semiconductor light source described herein whereby two acceptor impurities are introduced, according to the invention, consists in that a p-n junction is formed on the surface of the base silicon carbide by adding an impurity with a low activation energy and high solubility in silicon carbide and then a luminescence activator is introduced from the same side to form a central layer.

To increase the brightness of the light sources oxygen is preferably added to the inert atmosphere.

Still with the same object in view the method of manufacturing a semiconductor light source whereby two acceptor impurities are introduced, according to the invention, consists in that a luminescence activator is introduced into the surface of the base silicon carbide and then a p-n junction is formed from the same side by means of an acceptor impurity with a low activation energy and high solubility in silicon carbide.

The p-n junction may be formed by aluminium diffusion in an inert atmosphere into which vapours of rare-earth elements are introduced.

It is preferable that the luminescence activator of acceptor type is introduced by diffusion and that the p-n junction is also formed by diffusion. To increase the brightness of the light source manufactured by the latter method the diffusion of the acceptor impurity with a low activation energy must be carried out in an inert atmosphere with addition of a small amount of luminescence activator to avoid its outward diffusion from the silicon carbide.

The invention will be better understood from the following description of its specific embodiments.

The semiconductor source of light within the visible region of the spectrum described herein consists of a base crystal of n-type silicon carbide, 300 micron thick, with a majority donor (nitrogen) concentration of $0.8 \times 10^{18}$ to $5 \times 10^{18}$ cm$^{-3}$ whose surface layer, 0.1 to 3 microns thick, has a conductivity opposite to that of the base crystal, i.e. p-conductivity as it is doped with an acceptor impurity, such as aluminium, and a thin layer, 0.05 to 1.0 micron thick, adjacent to said p-layer, which is doped with luminescence activators of donor and acceptor types, such as oxygen and boron, to concentrations of $0.1 \times 10^{18}$ to $2 \times 10^{18}$ cm$^{-3}$ the resistivity of this layer being greater than the resistivity of the base layer by at least three orders of magnitude.

All the objects, features and advantages of the invention will become more apparent by reference to the following description in conjunction with the accompanying drawing, which shows a sectional view of the semiconductor light source according to the present invention.

The semiconductor light-emitting source operating in the visible region consists of the base crystal 1, 300 microns thick, doped with nitrogen to a concentration not below $0.8 \times 10^{18}$ cm$^{-3}$. A p-layer 2, 0.7 micron thick, is formed from the face side of this crystal by aluminium doping to an average concentration of $2 \times 10^{19}$ cm$^{-3}$ and a layer 3, 0.5 micron thick, adjacent to the p-layer is formed nitrogen and boron doping to concentrations not below $0.8 \times 10^{18}$ cm$^{-3}$. The resistivity of the base crystal and of the activated layer is 0.03 ohm cm and $10^4$ ohm cm, respectively.

This light source provides amber emission brightness of about 50 to 100 nit at a current density of 0.5 A/cm$^2$, remains serviceable at a temperature of $-60°$ C and below and has a nearly linear dependence of emission on current $I \sim j^{0.8-0.9}$, where I is the emission brightness and j is the current density.

In another embodiment of a silicon carbide light source emitting amber light the base crystal of n-type silicon carbide, 300 microns thick, is doped with nitrogen and oxygen to a concentration of $2.5 \times 10^{18}$ cm$^{-3}$. The p-layer, 0.5 micron thick, is doped with aluminium to an average concentration of $10^{19}$ cm$^{-3}$ and a 0.3-micron layer adjacent to this layer is doped with donor impurities, such as nitrogen and oxygen, and an acceptor impurity, such as boron, to a concentration of $1.5 \times 10^{18}$ to $2.5 \times 10^{18}$ cm$^{-3}$.

This light source provides amber emission brightness of about 50 to 250 nit at a current density of 0.5 A/cm$^2$ or up to 500 nit at higher current densities (about 1 to 2 A/cm$^2$), remains serviceable at temperatures down to $-100°$ C and below and has a nearly linear dependence of emission on currents $I \sim j^{0.85-0.95}$.

Following is a discussion of yet another embodiment of a silicon carbide light source. This too consists of an n-type base crystal, 300 microns thick, doped with nitrogen and oxygen to a concentration of $0.8 \times 10^{18}$ to $2 \times 10^{18}$ cm$^{-3}$, a p-layer, 0.1 micron thick, doped with aluminium to a concentration of $10^{19}$ cm$^{-3}$ and a 1-micron layer adjacent to the p-layer, doped with a donor impurity - nitrogen and oxygen and with an acceptor impurity-beryllium to a concentration of $0.8 \times 10^{18}$ to $2 \times 10^{18}$ cm$^{-3}$. Such light sources provide red emission brightness of about 10 to 50 nit at a current density of 0.5 A/cm$^2$, remain serviceable at a temperature of $-60°$ C and have a linear dependence of emission on current $I \sim j^{0.9-1.0}$.

The n-type base crystal, 300 microns thick, may be doped with nitrogen and oxygen to a concentration of $0.8 \times 10^{18}$ cm$^{-3}$; the 0.15-micron p-layer of this device is doped with gallium to a concentration of $3 \times 10^{18}$ cm$^{-3}$ and the 0.05-micron layer adjacent to the p-layer is doped with a donor impurity-nitrogen and oxygen and with an acceptor impurity — aluminium to a concentration of $0.8 \times 10^{18}$ cm$^{-3}$.

Such light sources provide blue-green emission brightness of about 20 to 30 nit at a current density of 0.5 A/cm$^2$, remain serviceable at temperatures down to $140°$ C and below and have a linear dependence of emission on current $I \sim j^{0.9-1.0}$.

Another embodiment of a silicon carbide light source, according to the invention, also consists of a base crystal, 250 microns thick, doped with nitrogen and oxygen to a concentration of $1.5 \times 10^{18}$ cm$^{-3}$, a p-layer 0.15 micron thick, doped with aluminium to a concentration of $2 \times 10^{19}$ cm$^{-3}$, and a 0.10-micron activated layer adjacent to the p-layer, doped with a donor impurity — nitrogen and oxygen and with an acceptor impurity — gallium to a concentration of $1.5 \times 10^{18}$ cm$^{-3}$.

This light source provides light-blue emission brightness of 10 to 30 nit at a current density of 0.5 A/cm$^2$, remains serviceable at temperatures down to $-140°$ C and below and has a nearly linear dependence of emission on current $I \sim j^{0.9-1.0}$.

Following is a description of still another embodiment of a silicon carbide light source. This comprises a base crystal, 350 microns thick, doped with nitrogen and oxygen to a concentration of up to $2 \times 10^{18}$ cm$^{-3}$, a p-layer, 0.3 micron thick, doped with aluminium to a concentration of $10^{19}$ cm$^{-3}$ and a 0.3-micron activated layer adjacent to the p-layer, doped with a donor impurity — nitrogen and oxygen and with an acceptor impurity-scandium to a concentration of $2 \times 10^{18}$ cm$^{-3}$.

This light source provides green emission brightness of about 40 to 100 nit at a current density of 0.5 A/cm$^2$, remains serviceable at temperatures down to $-60°$ C and has a nearly linear dependence of emission on current.

The light sources described herein have a number of advantages. Of special importance for normal operation of the device in the region of low temperatures is the provision of a doped low-resistivity p-layer. This layer enables the charge carriers to be efficiently injected from the p-region side at low temperatures, as, despite the fact that at lower temperatures hole concentration in p-type silicon carbide sharply decreases, the hole concentration in a heavily doped low-resistivity p-layer at a temperature of about $-60°$ C proves to be much higher than charge carrier concentration in a high-resistivity activated layer. The same feature affects the operating voltage of the device enabling it to be decreased to a minimum possible level.

Semiconductor light sources with a three-layer structure described herein are manufactured as follows: first an acceptor impurity with a low activation energy, such as aluminium, and then an activator, such as boron, are diffused into silicon carbide crystals. Temperature conditions and diffusion times are selected depending on the concentration of the doping majority donors in the base material in such a way that the p-layer should be mainly formed by the atoms of the diffusing aluminium and the intermediate compensated n-region, 0.05-1 micron wide, should be doped with boron and oxygen to a concentration of $0.1 \times 10^{18}$ to $2 \times 10^{18}$ cm$^{-3}$. For example, to manufacture devices with amber emission described above aluminium diffusion must be carried out at a temperature of 2000° to 2300° C for 1 to 5 hours and subsequent boron diffusion, at a temperature of 1900° to 1980° C for 2 to 10 minutes.

The light sources manufactured by this method provide amber emission brightness of 30 to 250 nit at a current density of 0.5 A/cm$^2$, the emission brightness rising to 500 nit and above as the current density is increased to 1 to 20 A/cm$^2$. These light sources remain serviceable at temperatures down to $-60°$ C and below and have a nearly linear dependence of emission brightness on current $I \sim j^{0.75-1.0}$.

In the given method epitaxial growth of aluminium-doped layers from the liquid phase, such as solutions of rare-earth elements, or from the vapour phase may be used instead of the first stage of separate diffusion — aluminium diffusion, to form the p-layer.

To simplify the technique of aluminium diffusion into an n-type silicon carbide and overcome much of the difficulties involved in such diffusion caused by decomposition of silicon carbide crystals and large reactivity of aluminium vapours at very high diffusion temperatures, vapours of rare-earth elements are introduced into the inert atmosphere in which the diffusion is carried out.

Vapours of oxygen are added to the inert atmosphere at the first stage of diffusion to increase emission brightness of the light source.

With another method said three-layers structure is obtained by first diffusing the luminescence activator, such as boron, at a temperature of 1800° to 2050° C for 4 to 10 hours and then diffusing an acceptor impurity with a low activation energy, such as aluminium, at a temperature of 2100° to 2200° C for 0.5 to 2 hours.

The temperature conditions and diffusion times are selected so that at the first stage of diffusion the p-layer is not actually formed or is formed at a depth smaller than during the second stage of separate diffusion, the diffusion of aluminium. To avoid outward diffusion of luminescence activator, such as boron, and, consequently to prevent the decrease in emission brightness of such light sources the second stage of diffusion, such as aluminium diffusion, is carried out in graphite crucibles with addition of a small amount of activator, such as boron.

Instead of the first stage of separate diffusion, such as diffusion of boron, it is possible to use crystals which are rather uniformly doped with an acceptor impurity — boron and also with a donor impurity — nitrogen and oxygen.

The technique of separate diffusion of impurities into silicon carbide makes it possible successively to introduce into the central activated layer of the structure various impurities which activate luminescence in silicon carbide in various regions of the spectrum (for example, boron, gallium, aluminium, berrylium and scandium are activators of amber, light-blue, blue-green, red, and green emission bands, respectively).

The use of the given structure of a silicon carbide light source enables, among other things, increasing by 3 to 4 times emission brightness of the already existing sources of amber light activated by boron, decreasing the rejection rate of the manufactured devices by at least two times, extending their operating temperature range and manufacturing light sources with other spectral components of emission.

Silicon carbide light sources are used for visual display of data as well as for recording of data on light-sensitive material to be used in data input and output facilities of computers, in various display boards, digital instruments, etc.

What is claimed is:

1. A semiconductor light source comprising a silicon carbide crystal having a three-layer structure comprising: an N-type conductivity base region doped with nitrogen and having a concentration of basic uncompensated donors varying from $0.8 \times 10^{18}$ to $5 \times 10^{18}$ $cm^{-3}$; a P-type conductivity layer having a thickness of 0.05 to 1 micron, doped with an acceptor admixture having a minimal activation energy and solubility in said silicon carbide on the order of $2 \times 10^{18}$ to $2 \times 10^{20}$ $cm^{-3}$, said P-type layer forming, together with said N-type region, a P-N junction; an N-type conductivity layer of silicon carbide located between said P-type layer and said N-type conductivity base region and having a thickness of 0.05 to 1 micron and a resistivity of at least three orders of magnitude higher than the resistivity of said N-type conductivity base region, said N-type layer being doped with luminescence activators of donor and acceptor types of conductivity to a concentration of $0.1 \times 10^{18}$ to $2 \times 10^{18}$ $cm^{-3}$.

2. A semiconductor light source as of claim 1 wherein the luminescence activator of donor type is a substance selected from a group consisting of oxygen and nitrogen and the acceptor-type luminescence activator is boron.

3. A semiconductor light source as of claim 1 wherein the donor-type luminescence activators are nitrogen and oxygen and the acceptor-type luminescence activator is a substance selected from a group consisting of beryllium, aluminium, gallium and scandium.

4. A method of forming a semiconductor light source comprising: a nitrogen-doped n-type silicon carbide crystal with an uncompensated majority donor concentration of $0.8 \times 10^{18}$ to $5 \times 10^{18}$ $cm^{-3}$; a p-n junction formed by introducing an acceptor impurity which has a low activation energy and a high solubility in said silicon carbide, said junction being electroluminescent within the visible region of the spectrum; a p-layer, 0.05 to 1 micron thick, doped with an acceptor impurity with a minimum activation energy and with a solubility in said silicon carbide of about $2 \times 10^{18}$ to $2 \times 10^{20}$ $cm^{-3}$; a base layer of silicon carbide which is part of said silicon carbide crystal and has an uncompensated donor concentration of $0.8 \times 10^{18}$ to $5 \times 10^{18}$ $cm^{-3}$; a central layer located between said p-layer and said base layer and doped after formation of the p-n junction with luminescence activators of donor and acceptor types by adding the luminescence activators from the side from which impurities were introduced to form the p-n junction, to concentrations of $0.1 \times 10^{18} - 2 \times 10^{18}$ $cm^{-3}$; said central layer is 0.05 to 1 micron thick and its resistivity is greater than the resistivity of said base layer by at least three orders of magnitude.

5. The method as of claim 4 wherein a p-n junction is formed by aluminium diffusion in an inert atmosphere into which vapours of rare-earth elements are introduced.

6. The method as of claim 5 wherein a p-n junction is formed by adding oxygen to the inert atmosphere.

7. A method of forming a semiconductor light source comprising: a nitrogen doped n-type silicon carbide crystal with an uncompensated major donor concentration of $0.8 \times 10^{18}$ to $5 \times 10^{18}$ $cm^{-3}$; a p-layer, 0.05 to 0.1 micron thick, doped with an acceptor impurity which has a minimum activation energy and a solubility in said silicon carbide of about $2 \times 10^{18}$ to $2 \times 10^{20}$ $cm^{-3}$; a base layer which is part of said silicon carbide crystal and has an uncompensated donor concentration of $0.8 \times 10^{18}$ to $5 \times 10^{18}$ $cm^{-3}$; a central layer located between said p-layer and said base layer and doped with luminescence activators of donor and acceptor types to concentrations of $0.1 \times 10^{18}$ to $2 \times 10^{18}$ $cm^{-3}$; a p-n junction formed after the doping of the central layer by adding an acceptor impurity with a low activation energy and a high solubility in said silicon carbide, said junction being electroluminescent within the visible region of the spectrum; said central layer is 0.05 to 1 micron thick and its resistivity is greater than the resistivity of said base layer by at least three orders of magnitude.

8. The method as of claim 7 wherein a p-n junction is formed by aluminium diffusion in an inert atmosphere into which vapours of rare-earth elements are introduced.

9. The method as of claim 8 wherein a p-n junction is formed by adding oxygen to the inert atmosphere.

10. The method as of claim 7 wherein a luminescence activator of acceptor type is introduced by diffusion and a p-n junction is also formed by diffusion, the diffusion of the acceptor impurity with a low activation energy being carried out in an inert atmosphere with addition of a small amount of a luminescence activator.

* * * * *

UNITED STATES PATENT OFFICE
CERTIFICATE OF CORRECTION

Patent No. 3,986,193       Dated October 12, 1976

Inventor(s) JURY ALEXANDROVICH VODAKOV, ET AL

It is certified that error appears in the above-identified patent and that said Letters Patent are hereby corrected as shown below:

In the title:

Change "SICL" to read -- SIC --.

Column 1, line 1, change "SICL" to read -- SiC --.

Signed and Sealed this

Twenty-eighth Day of December 1976

[SEAL]

Attest:

RUTH C. MASON
Attesting Officer

C. MARSHALL DANN
Commissioner of Patents and Trademarks